April 18, 1967 SEIJI KANAI ETAL 3,315,097

PULSE-GENERATOR USING PUNCH-THROUGH-AVALANCHE TRANSISTOR PRODUCING BOTH PULSE AND STEP-WAVE OUTPUTS IN RESPONSE TO SINGLE SWEEP INPUT

Filed April 15, 1964

3 Sheets-Sheet 1

(b)

April 18, 1967 SEIJI KANAI ETAL 3,315,097

PULSE-GENERATOR USING PUNCH-THROUGH-AVALANCHE TRANSISTOR PRODUCING BOTH PULSE AND STEP-WAVE OUTPUTS IN RESPONSE TO SINGLE SWEEP INPUT

Filed April 15, 1964

3 Sheets-Sheet 3

(b)

United States Patent Office 3,315,097

Patented Apr. 18, 1967

3,315,097

PULSE-GENERATOR USING PUNCH-THROUGH-AVALANCHE TRANSISTOR PRODUCING BOTH PULSE AND STEP-WAVE OUTPUTS IN RESPONSE TO SINGLE SWEEP INPUT

Seiji Kanai, Kitatama-gun, Tokyo, and Takeo Tominaga, Kodaira-shi, Tokyo, Japan, assignors to Nippon Telegraph and Telephone Public Corporation, Tokyo, Japan Filed Apr. 15, 1964, Ser. No. 359,944
Claims priority, application Japan, Apr. 25, 1963, 38/21,055
8 Claims. (Cl. 307—88.5)

This invention relates to a pulse generating circuit utilizing the avalanche multiplying phenomenon of a transistor.

FIGURES 1*a* and *b* are formation diagrams for explaining the avalanche multiplying action of a transistor and a voltage-current characteristics diagram, respectively.

It is generally well known htat, when a transistor having an avalanche multiplying action is connected as in FIGURE 1*a*, such voltage-current characteristics shown in FIGURE 1*b* will be generated between two terminals 1 and 2.

In FIGURE 1*a* in case of P-N-P junction transistor, the emitter E of a P-type conductive layer is connected with the base B of an N-type conductive layer through a resistance $R_1$, the negative electrode of an electric source V is connected to the collector C of the P-type conductive layer through a resistance $R_2$ and the positive electrode of the electric source V is connected to the emitter along with the base terminal. As the voltage corresponds to the backward bias for an ordinary P-N junction, only a slight leakage current $I_{co}$ will flow between the collector and the base. This current $I_{co}$ will flow through the base resistance $R_1$ and will give a small forward bias voltage to the base-emitter junction. Therefore, an emitter current $I_e$ will flow into the base layer. In this inflow current, $\alpha I_e$ (wherein $\alpha$ is a current amplifying factor between the emitter and collector) will flow as a collector current $I_c$ out of the collector terminal and $(1-\alpha) I_e$ will flow against the flow of $I_{co}$ out of the base terminal and will reduce the forward bias current of the emitter. So long as $\alpha$ is smaller than 1, the emitter current $I_e$ will be kept small. However, if the collector voltage is elevated to a voltage range wherein $\alpha$ is larged than 1 because of the avalanche multiplying action, the current direction of $(1-\alpha) I_e$ will be reversed, the forward bias voltage of the emitter will be made higher and the emitter current $I_e$ will be further increased by the positive feedback process. As a result, the collector current $I_c$ will rise quickly and restriction to the current will be only the total resistance in the circuit and the collector voltage is required only to keep $\alpha$ larger than 1 at least.

FIGURE 1*b* is a voltage-current characteristics diagram showing such relation as is mentioned above. It has a negative resistance region. The collector voltage $V_c$ is taken on the abscissa and the collector current $I_e$ is taken on the ordinate in the diagram. An operating point which was first in a low current state A will rise over an apex C along the load line until it reaches a high current state B. In order to restore this operating state to the initial low current state, the collector voltage may be reduced enough. It is needless to say that, if the emitter circuit is cut off or biased backward, the operating state will be also returned to the initial low current state. It is known that the transition to the high current state from the low current state by the avalanche multiplying action will operate within a very short time. It is physically thought that, in the avalanche multiplying region, a high electric field will be produced, therefore the carrier running through the base will be accelerated and the transition time will be reduced. It is well known that the avalanche transistor has a feature that it can perform opening and closing (switching) operations at speeds higher than, an ordinary transistor for example having the same structure and dimensions.

As for the utilization of avalanche transistors generally known today, there are examples such as an opening and closing circuit or a relaxation oscillation circuit, mostly applying the above mentioned negative resistance phenomenon.

In such application, though the high responding speed of the transistor is utilized, the range of applications is limited as compared with the general operation of the transistors. For example, in the case of generating a staircase voltage, every circuit is formed usually of a combination of transistors and diodes or electron tubes but there has been seen no circuit which applies an avalanche transistor.

The present invention is to provide a pulse generating circuit wherein only one transistor having carrier multiplying action in a collector junction (emitter junction) and having a punch-through voltage lower than the break down voltage is utilized applying a sweep pulse voltage, for example, between a base and a collector, to generate a sharp pulse current between the base and collector and at the same time to generate a staircase voltage, for example, between an emitter and a base.

A principal object of the present invention is to provide a circuit which can generate pulses of desired number, the time intervals of the pulses can be easily controlled, by using only one transistor meeting the below mentioned conditions.

Another object of the present invention is to provide a circuit in which the generated current pulse can be made much narrower than in the case of ordinary self-running oscillation as the transistor changes from the conducting state to the nonconducting state automatically due to the condenser inserted on the emitter (or collector) side.

A further object of the present invention is to provide a basic circuit which can be modified and applied in many ways by virtue of its simplicity and the voltage wave sweeping the collector (or emitter) side may be not only a saw-tooth wave but also any settled wave (for example, a constant voltage wave) and by selecting the wave form, applications to analogue digital conversion are made possible.

Figure 4:
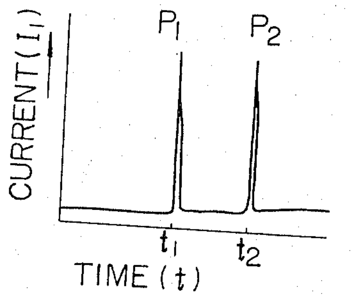
Figure 4:
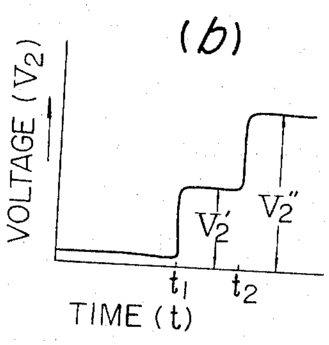

FIGURES 4 and 4*b* show wave form diagrams of a generated pulse.

Figure 5:
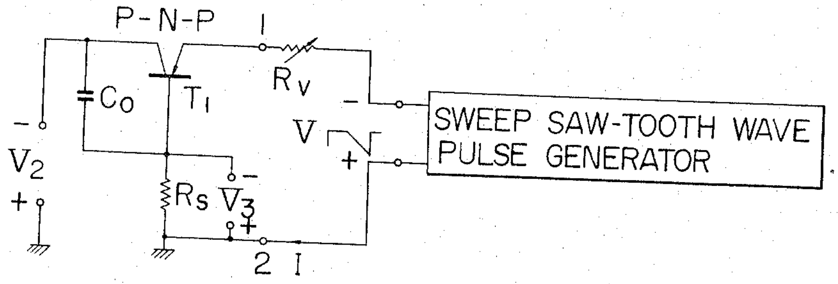

FIGURE 5 shows another embodiment of a pulse generating circuit of the present invention.

Figure 6:
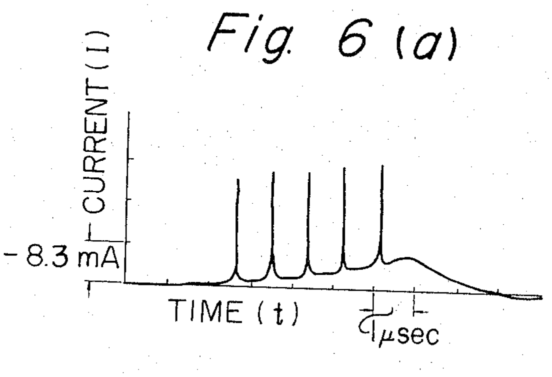
Figure 6:
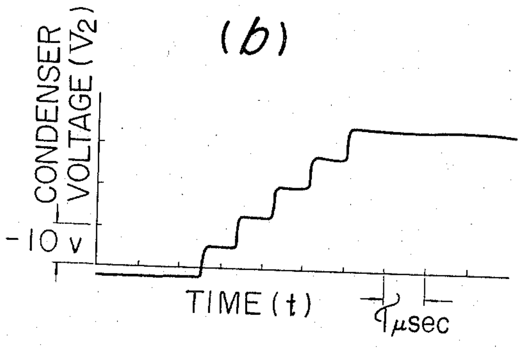

FIGURES 6*a* and 6*b* show diagrams of pulse wave forms generated by the construction.

Figure 2:
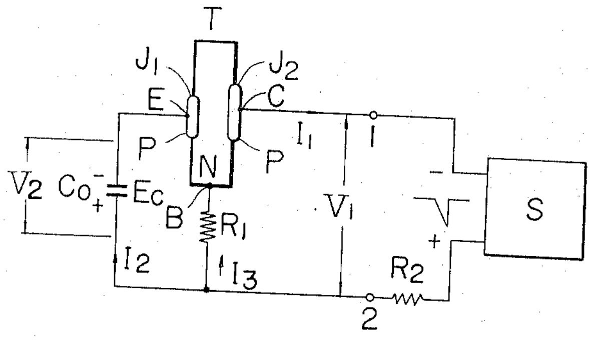
FIGURE 2 is a basic formation diagram of an embodiment of a pulse generating circuit using a transistor of the present invention.

In FIGURE 2, T is, for example, a P–N–P junction transistor having an avalanche multiplying action and applied to the circuit of the present invention. $C_0$ is a condenser, $R_1$ is a resistance connected to a base layer, S is a sweep (pulse) voltage generator and $R_2$ is a resistance for adjusting the internal resistance of the sweep (pulse) voltage generator S.

The condenser $C_0$ and the resistance $R_1$ are inserted in series between the emitter E and the base B of the P–N–P junction transistor T. The sweep pulse voltage generator S is connected between the collector C and the connecting point of resistance $R_1$ and condenser $C_0$.

Now, for example, a saw-tooth wave (pulse) voltage of the sweep (pulse) generator is applied between terminals 1 and 2 or between the collector electrode C and the base electrode B through the resistance $R_2$ as in the drawing.

Further, the polarity of said applied (pulse) voltage is so arranged that the terminal 1 may be negative and the terminal 2 may be positive in such case as is illustrated. In such state, when the sweep voltage increases, the current will flow separately to the resistance $R_1$ and condenser $C_0$ and the current $I_2$ will flow into the emitter junction. Herein, if the condenser $C_0$ is properly selected and the rise of the sweeping saw-tooth wave pulse is quick enough, the reactance shown by the condenser $C_0$ will become smaller as compared with the value of the resistance $R_1$ and therefore the initial current will flow mostly through the condenser $C_0$.

Figure 1:
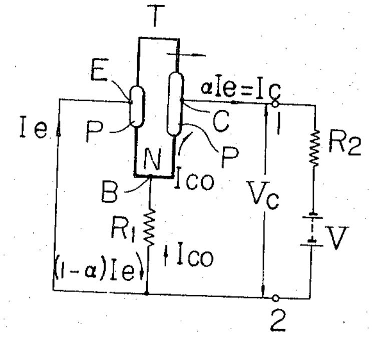
Figure 1:
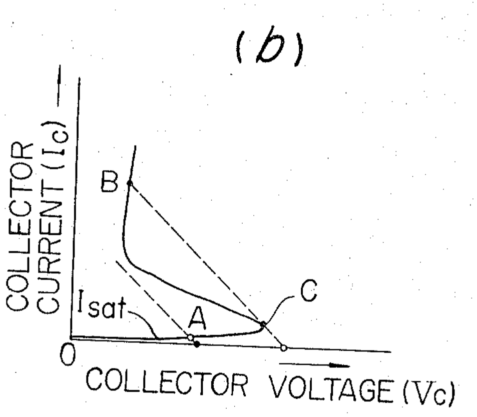
Figure 3:
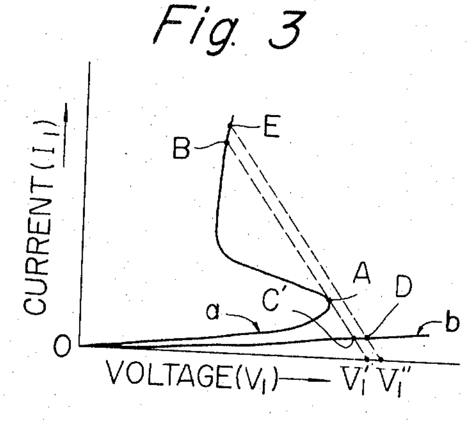
FIGURE 3 is a voltage-current characteristics diagram of a pulse generating circuit of the present invention.

That is to say, in the first transitional state in which the sweeping saw-tooth wave pulse is applied, the condenser $C_0$ acts as a kind of short-circuit between the emitter and base and so equivalently makes the circuit formation shown in FIGURE 1*a*. Therefore, the characteristics between the terminals 1 and 2 will transitionally show such voltage-current characteristics similar to those of an avalanche transistor as are shown in FIGURE 3. When the voltage between the terminals 1 and 2 reaches a point A where the positive feedback occurs due to the avalanche multiplying action, the current $I_1$ will quickly increase and will rise up to a stable point B along the load line. Almost all of this current will flow into the emitter through the resistance $R_2$ and condenser $C_0$. However, in such case, the condenser is to be charged and the condenser will be charged in the polarity making the emitter terminal negative. As these charges bias the emitter backward, the transistor will not be able to remain in the operating state of the point B in FIGURE 3, will soon lose the conducting state, and will be driven into an open state. As the emitter is opened, only the backward bias voltage will remain between the base and collector and the operating point will shift to C'. The point C' is a stable point determined mostly by the intersection of the backward bias voltage characteristics *b* of the collector junction and the load line determined by the total resistance of the circuit in the noted voltage. In observing the above stated operating manner by the variation of the electric current against the time, it is found that a sharp current pulse appears in the current $I_1$ as in FIGURE 4*a*. This conducting state is kept only for the charging time determined by the time constant of the circuit. As soon as a current pulse is generated, a charging voltage will appear at both ends of the condenser. If the time when the current pulse is generated is $t_1$, the pulse current will be so sharp that, as shown in FIGURE 4*b*, a voltage $V'_2$ of a staircase wave form will be obtained at the time $t_1$ in $V_2$ or between both ends of the condenser $C_0$. The rise and fall of the current pulse $P_1$ and the rise of the staircase voltage will be limited by a time constant determined by the transition time of the avalanche multiplying action at the operating point, i.e. the time of transition from the point A to the point B or vice versa, and by the time constant which is determined by the resistance of the entire circuit and the capacity of the condenser. As described above, the transition by the avalanche multiplying action is generally very quick. The above mentioned limitation may be said to be determined mostly only by the time constant. Therefore, with a transistor having an avalanche multiplying action, a current pulse which is sharp enough can be generated, for example, from the resistance terminal on the collector side and at the same time a staircase pulse can be taken out of the high impedance terminal ($V_2$).

This is a feature and a basic principle of the present invention. When, for example, a saw-tooth wave pulse is used for the sweep voltage as here, it will be possible to repeat such operation as is mentioned above. After a current pulse $P_1$ is generated, the emitter will be held in a backward bias state and therefore the current $I_1$ will be held at the point C' in FIGURE 3 in a low current state. Now, if the sweep voltage applied to the collector junction in FIGURE 2 becomes higher with the time, the backward bias of the collector will become deeper against the base.

Further, in order to make the backward bias deeper, a constant voltage may be used in the operation instead of the above mentioned sweep voltage. However, in case of the constant voltage, it will be necessary to superimpose some signal voltages.

Therefore, the potential of the intermediate region between emitter E and collector C will also be lowered.

In this state, both depletion layers extending from the collector and emitter will be in contact, and hence come into a punch-through state which wraps the base regions near the emitter and the collector. Therefore, the drop of the collector potential will directly bring about a potential drop in the depletion layer just below the emitter.

Therefore, for example, in FIGURE 4, when the sweep voltage has increased by the mount corresponding to $V'_2$ at a time $t_2$ from the voltage at the time $t_1$ when the first voltage pulse was generated, the emitter junction will be released from the backward bias, will be again in a conducting state and will generate a pulse $P_2$ at a time $t_2$ as in FIGURES 4*a* and *b* and the second staircase wave form voltage $V_2''$ will be generated at both ends of the condenser.

The above relation shall be supplementally explained on the basis of the characteristics curves in FIGURE 3. First of all, in FIGURE 4*a*, after the pulse $P_1$ is generated, the current will be at the point C' in FIGURE 3. However, as the emitter is backward biased, if the sweep voltage increases, the current will reach the point D along the characteristics curve *b*. At this point, an avalanche multiplying action will occur and the characteristics curve should shift to the curve *b*. But, the load line will no longer meet the point A and the current will quickly rise to the point E as it is. At the same time, the condenser $C_0$ in FIGURE 2 is charged, then an open state by the backward bias voltage will be generated and the current will return to the vicinity of the point D.

It is thus possible to generate the third and fourth pulses. The staircase voltage of the condenser will reach the value corresponding to the wave top of the saw-tooth wave voltage. But, when the sweep ceases, the pulse will no longer be generated.

The number and time intervals of the pulses generated here are determined by the sweep wave form, rising time, wave height value, base resistance, circuit resistance and condenser capacity.

The above explanation has been limited to a P-N-P junction transistor. Needless to say, the same is true also in an N-P-N transistor having a reverse conductivity type or in the case where the emitter and the collector are interchanged. Further, the base resistance $R_1$ may be considered to be only a resistance of the semiconductor layer forming the base of the transistor or to include an externally inserted resistance connected to it. It is therefore possible to vary the characteristics of the pulse by varying the externally inserted resistance.

FIGURE 5 shows an embodiment of the circuit of the present invention.

FIGURE 6*a* is a current pulse wave form diagram. FIGURE 6*b* is a terminal voltage wave form diagram of the condenser.

As shown in the diagram, a P-N-P alloy junction transistor $T_1$ is connected on the emitter side to a saw-tooth wave pulse generator and on the collector side to a condenser $C_0$. A sweep voltage is applied between terminals 1 and 2 from the saw-tooth wave pulse signal generator. For example, if a voltage of a wave height value of 92 v. is impressed at a width of 10$\mu$ sec. of a saw-tooth wave pulse and repetition frequency of 90 c./s., the current I will generate such continuous pulses as are shown in FIGURE 6*a*. At the same time, the wave form of the voltage $V_2$, such continuous staircase pulses as are shown in FIGURE 6*b* will be obtained at the high impedance terminal.

Further, $R_v$ and $R_s$ in FIGURE 5 may be considered to correspond to $R_2$ and $R_1$ in FIGURE 2, respectively.

In the circuit of FIGURE 5, when $R_s$, $R_v$, $C_0$ and the wave height value and sweeping time of the sweep pulse are properly varied, the width, intervals, number and wave height value of the current pulses and the number, rising time, voltage and intervals of the staircase pulses can be varied.

As explained above, there is a feature that, when a sweep pulse voltage is applied to a transistor having an avalanche action, one or more sharp pulses and staircase pulses can be generated. So far, the basic circuit in which pulses can be generated by using only one transistor has been described in the above. However, an applied circuit in which many of such basic circuits are properly combined is also possible.

The pulse circuits of the present invention can be applied for example to the generation of a staircase voltage, required, for pulse modulating systems and is useful in converting a voltage to a digital code.

What is claimed is:

1. A pulse generating circuit using a transistor, having the punch-through voltage lower than the breakdown voltage of collector junction and having a carrier multiplying action in the collector junction at said punch-through voltage, comprising at least one condenser for closing the circuit between emitter and base of said transistor, and an electric current source for driving the collector of said transistor; said driving electric current source being made to sweep between collector and base in blocking direction of said collector junction with a sweep voltage which increases with passage of time, whereby a fixed number of pulse waves are generated at said collector terminal in a time interval within which said sweep voltage is higher than said punch-through voltage and during the same time that a stair-case wave form with steps corresponding in number to said generated pulses is generated across said condenser.

2. The pulse generating circuit using a transistor according to claim 1, wherein a condenser constitutes the sole circuit element connected between the emitter and base.

3. The pulse generating circuit using a transistor according to claim 1, wherein said transistor is a PNP type punch-through avalanche transistor.

4. The pulse generating circuit using a transistor according to claim 1, wherein said transistor is a NPN type punch-through avalanche transistor.

5. A pulse generating circuit using a transistor, comprising a transistor having the punch-through voltage lower than the breakdown voltage of emitter junction and having a carrier multiplying action in the emitter junction at said punch-through voltage, at least one condenser for closing the circuit between collector and base of said transistor, and an electric current source for driving the emitter of said transistor; said driving electric current source being made to sweep between emitter and base in blocking direction of said emitter junction with a sweep voltage which increases with passage of time whereby a fixed number of pulse waves are generated at said emitter terminal in a time interval within which said sweep voltage is higher than said punch-through voltage and during the same time that a stair-case wave form with steps corresponding in number to said generated pulses is generated across said condenser.

6. The pulse generating circuit using a transistor according to claim 5, wherein a condenser constitutes the sole circuit element connected between collector and base.

7. The pulse generating circuit using a transistor according to claim 5, wherein said transistor is a PNP type punch-through avalanche transistor.

8. The pulse generating circuit using a transistor according to claim 5, wherein said transistor is an NPN type punch-through avalanche transistor.

References Cited by the Examiner

UNITED STATES PATENTS

| | | | |
|---|---|---|---|
| 3,150,271 | 9/1964 | Robertson | 307—88.5 |
| 3,173,020 | 3/1965 | Seeds | 307—88.5 |
| 3,169,197 | 2/1965 | Memlink | 307—88.5 |

ARTHUR GAUSS, *Primary Examiner.*

J. S. HEYMAN, *Assistant Examiner.*